United States Patent
Kim et al.

(10) Patent No.: US 12,453,293 B2
(45) Date of Patent: Oct. 21, 2025

(54) REDUNDANT BOTTOM PAD AND SACRIFICIAL VIA CONTACT FOR PROCESS INDUCED RRAM FORMING

(71) Applicant: International Business Machines Corporation, Armonk, NY (US)

(72) Inventors: Youngseok Kim, Upper Saddle River, NJ (US); Takashi Ando, Eastchester, NY (US); Hiroyuki Miyazoe, White Plains, NY (US); Soon-Cheon Seo, Glenmont, NY (US); Dexin Kong, Redmond, WA (US)

(73) Assignee: International Business Machines Corporation, Armonk, NY (US)

( * ) Notice: Subject to any disclaimer, the term of this patent is extended or adjusted under 35 U.S.C. 154(b) by 782 days.

(21) Appl. No.: 17/564,331

(22) Filed: Dec. 29, 2021

(65) Prior Publication Data
US 2023/0210025 A1    Jun. 29, 2023

(51) Int. Cl.
*H10N 70/00* (2023.01)
*H10B 63/00* (2023.01)
*H10N 70/20* (2023.01)

(52) U.S. Cl.
CPC ........... *H10N 70/041* (2023.02); *H10B 63/30* (2023.02); *H10N 70/245* (2023.02); *H10N 70/826* (2023.02)

(58) Field of Classification Search
CPC .............. H10N 70/041; H10N 70/826; H10N 70/8833; H10B 63/30
See application file for complete search history.

(56) References Cited

U.S. PATENT DOCUMENTS

| | | | |
|---|---|---|---|
| 9,269,897 B2 | 2/2016 | Clark | |
| 9,362,496 B2 | 6/2016 | Walls | |
| 10,573,811 B2 | 2/2020 | Tseng | |
| 11,011,704 B2 | 5/2021 | Li | |
| 11,037,986 B2 | 6/2021 | Ando | |
| 2013/0187116 A1 | 7/2013 | Tan | |
| 2021/0135107 A1 | 5/2021 | Kim | |
| 2022/0223788 A1* | 7/2022 | Cheng | H10N 70/826 |

OTHER PUBLICATIONS

Debnjan Jana et al., "Conductive-bridging random access memory: challenges and opportunity for 3D architecture" Nanoscale Research Letters, Apr. 2015, pp. 1-23.

* cited by examiner

*Primary Examiner* — Shih Tsun A Chou
(74) *Attorney, Agent, or Firm* — Yuanmin Cai; Otterstedt & Kammer PLLC (57) ABSTRACT

A resistive memory includes: a bottom electrode; a first contact on the bottom electrode; a switching material pad on the first contact, wherein the switching material pad includes an oxide and a plurality of current conducting filaments in the oxide; a top electrode on the switching material pad; a plurality of sacrificial vias contacting the bottom electrode; a second contact that is connected to the bottom electrode; and a third contact that is connected to the top electrode.

16 Claims, 9 Drawing Sheets

REDUNDANT BOTTOM PAD AND SACRIFICIAL VIA CONTACT FOR PROCESS INDUCED RRAM FORMING

BACKGROUND

The present disclosure relates generally to a resistive memory technologies, and more particularly to electroforming techniques/structures for RRAM devices.

Resistive random access memory (RRAM) is considered as a promising technology for electronic synapse devices or memristors for neuromorphic computing, as well as high-density and high-speed non-volatile memory applications.

BRIEF SUMMARY

According to embodiments of the present invention, a resistive memory includes: a bottom electrode; a first contact on the bottom electrode; a switching material pad on the first contact, wherein the switching material pad includes an oxide and a plurality of current conducting filaments in the oxide; a top electrode on the switching material pad; a plurality of sacrificial vias contacting the bottom electrode; a second contact that is connected to the bottom electrode; and a third contact that is connected to the top electrode.

According to some embodiments of the present invention, a resistive memory includes: a substrate; an interlevel dielectric layer on the substrate; a transistor in the interlevel dielectric layer; a bottom electrode; a first contact on the bottom electrode; a switching material pad on the first contact, wherein the switching material pad includes a plurality of current conducting filaments; a top electrode on the switching material pad; a plurality of sacrificial vias contacting the bottom electrode; a second contact that is connected to the bottom electrode; and a third contact that is connected to the top electrode, wherein the third contact is electrically connected to the transistor.

According to at least one embodiment, a method of manufacturing a resistive memory includes: providing a front end of line structure comprising a substrate, an interlevel dielectric layer, a transistor in the interlevel dielectric layer, and a bottom electrode; forming a first contact on the bottom electrode; depositing an oxide layer; depositing an electrode material; etching the oxide layer and the electrode material to define a stack on the first contact; depositing a first fill material; etching the first fill material to form a plurality of first vias, including respective ones of first vias exposing the stack and the bottom electrode; performing a charge process, which electroforms a current conducting filament in the stack; depositing a passivation liner; filling the plurality of first vias with an insulating material fill, wherein the plurality of first vias, having the passivation liner and the insulating material fill form a plurality of sacrificial vias; etching the interlevel dielectric layer to form a plurality of second vias, with respective ones of the plurality of second vias exposing the stack, the bottom electrode, the transistor, wherein the etching removes some, but less than all, of the plurality of sacrificial vias; and forming contacts in the plurality of second vias, wherein the contacts electrically connect the transistor to the stack.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware mod-ule(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. Some embodiments may not have these potential advantages and these potential advantages are not necessarily required of all embodiments. For example, one or more embodiments may provide for:
- enable process induced electroforming in an oxide of a switching pad;
- typical electrical forming processes require large voltages, necessitating MOSFET device integration, by omitting these MOSFET electrical forming process, peripheral circuits and design may be simplified;
- typical electrical forming processes require a separate preparation time to select a target resistive element and form conductive filaments after the fabrication process, by facilitating the electroforming process, the separate preparation time may be omitted.

These and other features and advantages of the present invention will become apparent from the following detailed description of illustrative embodiments thereof, which is to be read in connection with the accompanying drawings.

BRIEF DESCRIPTION OF THE DRAWINGS

Preferred embodiments of the present invention will be described below in more detail, with reference to the accompanying drawings.

DETAILED DESCRIPTION

According to some embodiments, an e-beam or plasma process is applied to electroform a current conducting filament in a dielectric switching material (e.g., an oxide) of a RRAM or CBRAM device. According to at least one embodiment, the e-beam or plasma process provides charges to a bottom electrode, inducing voltage differences for a forming process. According to some aspects, a RRAM/CBRAM device includes a plurality of filled sacrificial via structures over a bottom plate electrically connected to the bottom electrode.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as "etching". For example, etching includes techniques of wet etching, dry etching, chemical oxide removal (COR) etching, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method and the structures formed thereby are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

According to some embodiments, a plasma process is applied to electroform a current conducting filament in a dielectric switching material (e.g., an oxide) of a RRAM or CBRAM device. According to at least one embodiments, the plasma process has a Poisson area scaling, with higher forming voltages for smaller device sizes. According to some aspects the forming voltages at sub-um dimensions are greater than about 2 volts (V), and the forming voltages increase as an area that is exposed to the plasma process is scaled. The area may be scaled by, for example, making the area of a sacrificial via larger or increasing the number of sacrificial via.

In the case of RRAM or CBRAM devices, the forming voltages cannot be supported by MOSFET in state-of-the-art CMOS technologies, therefore multiple MOSFETs need to be stacked, which can cause significant penalties, e.g., on device foot print. According to some embodiments, plasma process based electroforming techniques/structures, which do not rely on drive currents by MOSFET, can be used for device scaling.

Figure 1:
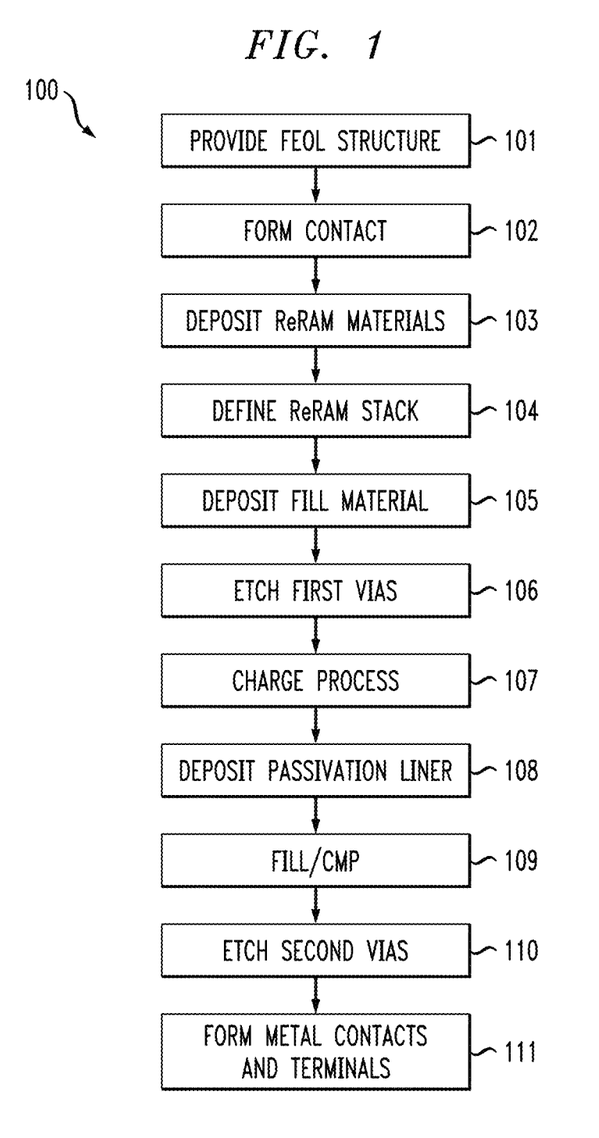
FIG. 1 illustrates electroforming methods according to one or more embodiments of the present invention.
Figure 2:
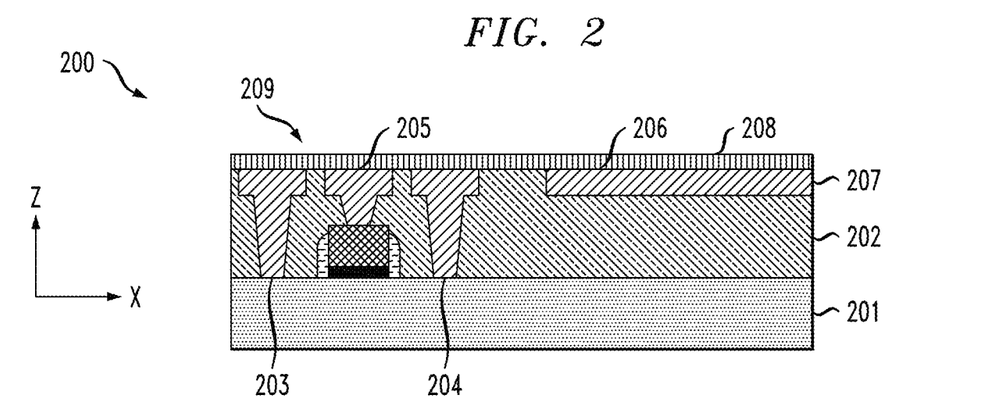
FIG. 2 is cross-section view of a device according to one or more embodiments of the present invention.
Figure 3:
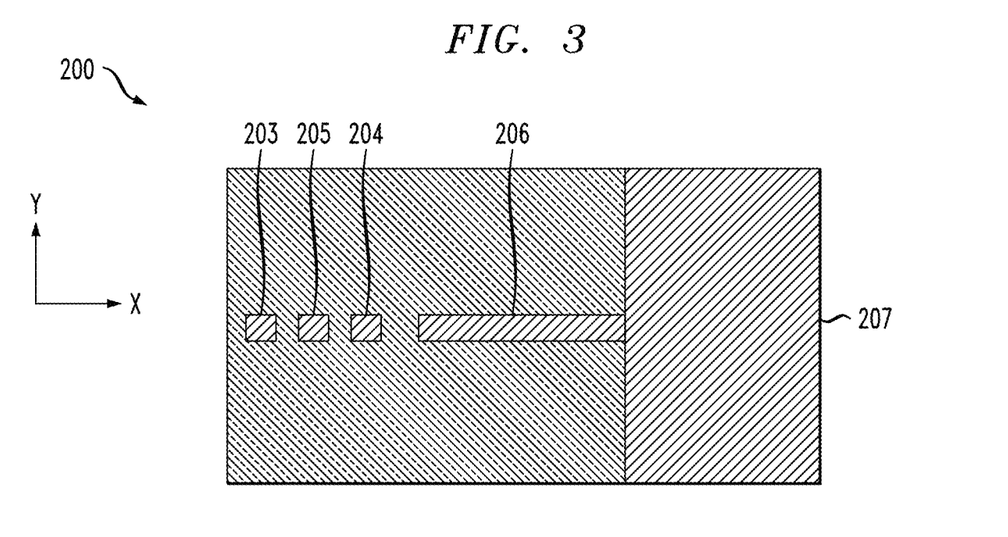
FIG. 3 is a planar view of the device of FIG. 2.

According to some embodiments and referring to FIG. 1, a method 100 of manufacturing a resistive memory comprises providing a front end of line structure (FEOL) at step 101 (see FIG. 2 and FIG. 3). The FEOL structure 200 includes a substrate 201 (e.g., formed of Silicon (Si)), an interlevel dielectric layer 202, a source terminal 203, a drain terminal 204, and a gate terminal 205 in the interlevel dielectric layer. The FEOL structure 200 further includes a bottom electrode 206 extending from a bottom plate 207, and a passivation layer 208 comprised of $Si(x)N(y)$ or other non-conductive material. According to at least one embodiment, the source terminal 203, the drain terminal 204, and the gate terminal 205 are elements of a transistor 209, which may further include doped source and drain regions, and a gate. It should be understood that FIG. 2 is a cross-section view of the FEOL structure 200 and that FIG. 3 is a top planar view of the FEOL structure 200.

According to some embodiments, the method 100 further includes forming a first contact on the bottom electrode at step 102 and depositing stack materials (e.g., an oxide layer followed by an electrode material) are deposited at step 103. According to some aspects, the method 100 further includes etching the stack materials at step 104 to define a stack on the first contact and depositing a first fill material at step 105. According to at least one embodiment, the method 100 includes etching the first fill material to form a plurality of first vias at step 106, including respective ones of first vias exposing the stack and the bottom electrode, performing a charge process at step 107, which supplies a charge to the structure that electroforms a current conducting filament in the stack, depositing a thin, e.g., 1 nm-10 nm thickness, passivation liner at step 108. The passivation liner may be formed of a diffusion barrier material (i.e., a material that serves as a barrier to prevent a conductive material such as copper from diffusing there through). Examples of diffusion barrier materials that can be used in providing the passivation liner include, but are not limited to, Ta, TaN, Ti, TiN, Ru, RuN, RuTa, RuTaN, W, or WN. In some embodiments, the diffusion barrier material can include a material stack of diffusion barrier materials. According to some embodiments, at step 109 the method includes filling the plurality of first vias with an insulating material fill, followed by a planarization (e.g., chemical mechanical polishing (CMP)). The plurality of first vias, having the passivation liner and the insulating material fill form a plurality of sacrificial vias. According to some embodiments, the method 100 further includes etching the interlevel dielectric to form a plurality of second vias at step 110, with respective ones of the second vias exposing the stack, the bottom electrode, the source terminal, the drain terminal, and the gate terminal, and forming contacts (e.g., with a conductive material) in the plurality of second vias at step 111. According to some aspects, the etching at step 110 removes some, but less than all, of the sacrificial vias; one or more of the sacrificial vias that contact the bottom electrode are preserved.

Figure 4:
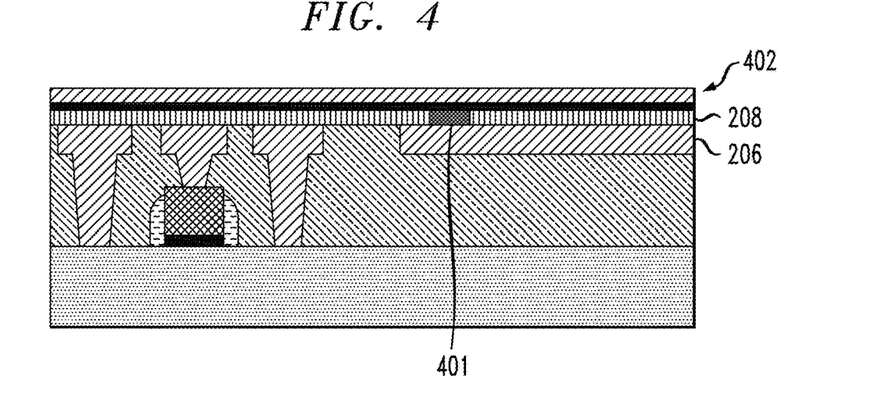
FIGS. 4-7 are cross-section views of a device according to one or more embodiments of the present invention.

According to some embodiments and referring to FIG. 4, the first contact 401 is formed on the bottom electrode 206 and stack materials 402 are deposited. The first contact 401 may be formed by patterning the passivation layer 208 and depositing a contact material. The contact material may be composed of an oxygen deficient conductive material such as, for example, Cu, Ta, TaN, Ti, TiN, Ru, RuN, RuTa, RuTaN, Co, CoWP, CoN, W, WN or any combination thereof. According to some aspects, the stack materials 402 include a dielectric switching material layer and a top electrode material layer. Examples of dielectric metal oxides that can be employed as the dielectric switching material layer include, but are not limited to, hafnium oxide (HfO$_x$), tantalum oxide (TaO$_x$), titanium oxide (TiO$_x$), aluminum oxide (AlO$_x$), or combinations thereof.

Figure 5:
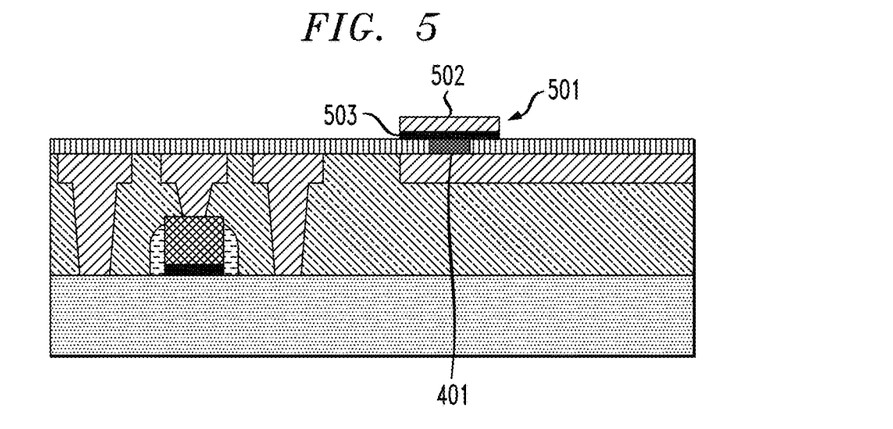
Figure 6:
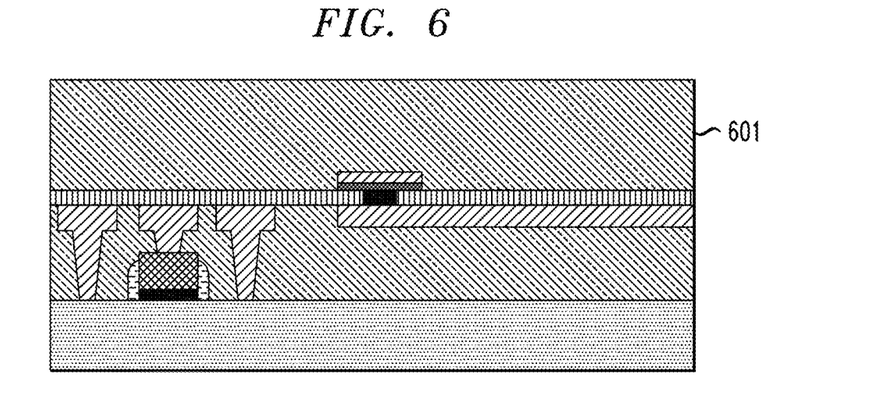

As shown in FIG. 5 and FIG. 6, the RRAM materials are etched to define a stack 501 on the first contact 401, and a first fill material 601 is deposited, according to one or more embodiments. According to some embodiments, the stack 501 includes a top electrode 502 on a dielectric switching material pad 503.

It should be understood that CBRAM is an example of an RRAIVI device. The structure of a CBRAM device includes the bottom electrode 206, which is electrochemically active (i.e., anode) or oxidized under external positive bias, such as silver (Ag) or copper (Cu), the dielectric switching material pad 503, which may be an oxide, and the top electrode 502, which is electrochemically inert (i.e., cathode), such as platinum (Pt), iridium (Ir), gold (Au), tungsten (W), or titanium-nitride (TiN).

According to at least one embodiment, the charge process at step 107 can be a plasma process or an e-beam process. The charge process at step 107 applies a charge sufficient to cause the accumulation of charges in the top electrode 502 and the first contact 401, where an imbalance in the area of a first exposed portion 701 and the area of second exposed portions 702 (see FIG. 7 and FIG. 8) induces imbalanced accumulated charges, a potential difference across the interlevel dielectric layer 202, and a dielectric breakdown, which is sufficient to electroform current conducting filaments 703 in the base switching material pad, which forms a switching material pad 704.

In the example of a plasma process, the charge process can be performed using an inductively coupled plasma (ICP), capacitively coupled plasma (CCP), or microwave generated plasma. Example plasma process conditions can include a pressure of about 1-2000 millitorr (mT), plasma power at about 0.3-5 kilowatts (kW), and Bias voltage of about 0-50 V, using gas chemistry including, for example, Ar, N2, H2, He, Xe, NH3 and their mixtures, for a process time or about 0.5-15 min. In the example of an e-beam process, the charge process can be performed using e-beam conditions such as an electron energy of about 0.01-100 kilovolts (kV) and a dose of about 100-5000 microcoulombs per centimeter squared (μC/cm2).

Figure 7:
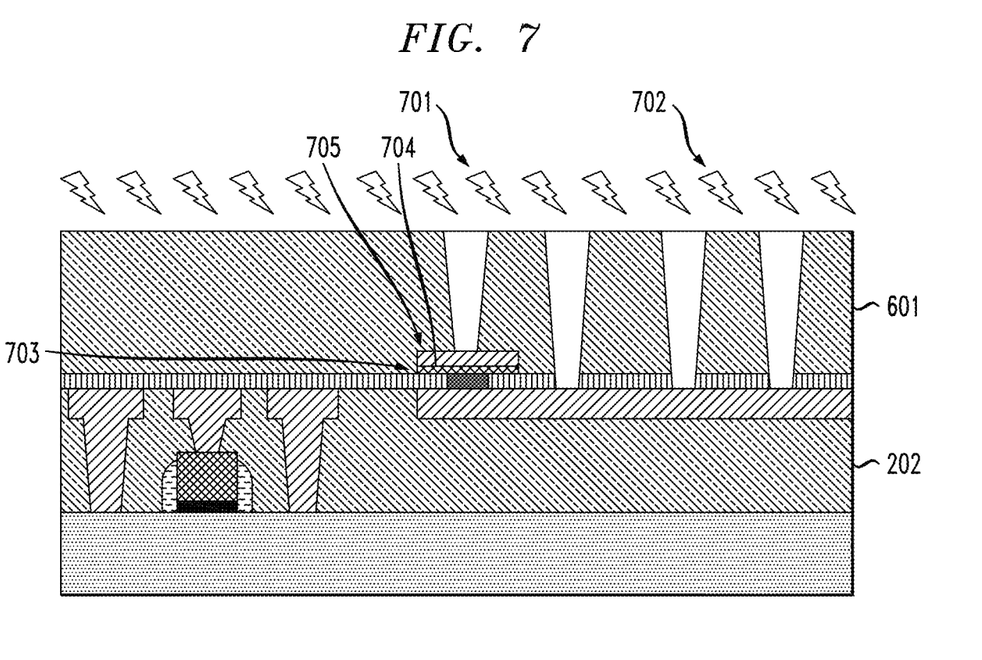
Figure 8:
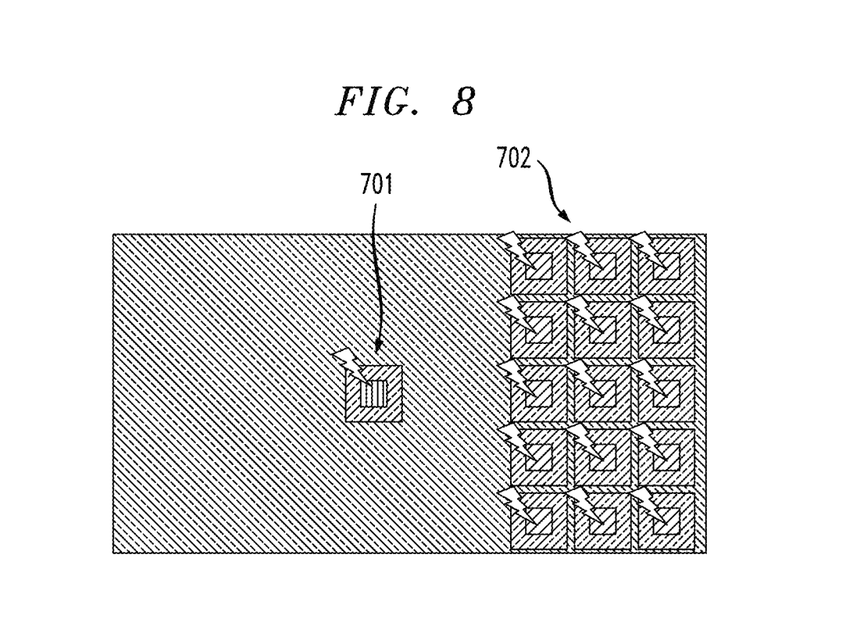
FIG. 8 is a planar view of the device of FIG. 7.

According to at least one aspect, a memory cell 705 comprises the first contact 401, the switching material pad 704, and the top electrode 502.

Figure 9:
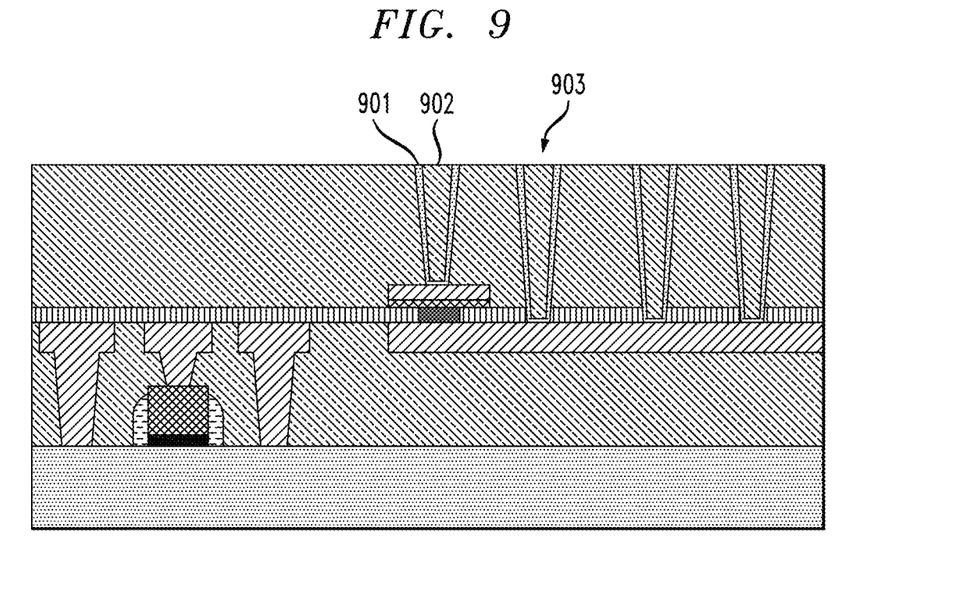
FIGS. 9-11 are cross-section views of a device according to one or more embodiments of the present invention.

According to some embodiments and referring to FIG. 9, the passivation liner 901 and an insulating material fill 902 are deposed and planarized (e.g., CMP). The plurality of first vias, having the passivation liner and the insulating material fill, form a plurality of sacrificial vias 903. According to at least one embodiment, the insulating material fill is one of an SiO2, SiN, or low-k film material.

Figure 10:
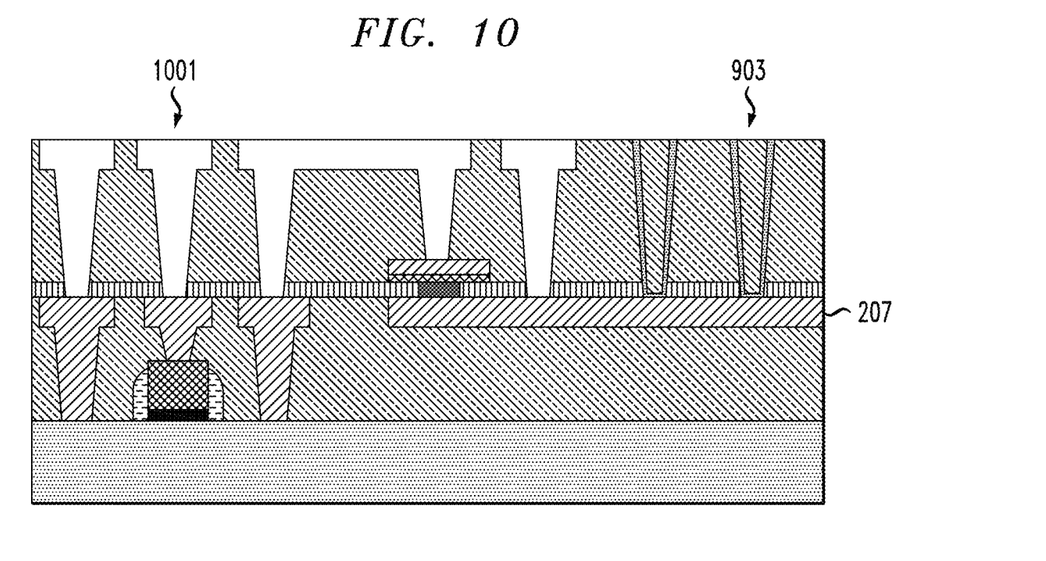

According to some embodiments and referring to FIG. 10, a plurality of second vias 1001 are formed that expose the stack, the bottom electrode, and the source/drain/gate terminals. According to some aspects, the etching removes some, but less than all, of the sacrificial vias 903; one or more of the sacrificial vias that contact the bottom electrode are preserved. According to some embodiments and referring to FIG. 11, metal contacts 1101 are formed in the plurality of second vias, the metal contacts 1101 are connected to the terminals, e.g., the source terminal 203, the drain terminal 204, and the gate terminal 205. According to some embodiments and referring to FIG. 11, a capping layer 1102 may be deposited over the device. The capping layer 1102 can be composed of any dielectric capping material including, for example, silicon carbide (SiC), silicon nitride (Si$_3$N$_4$), silicon dioxide (SiO$_2$), a carbon doped oxide, a nitrogen and hydrogen doped silicon carbide (SiC(N,H)) or a multilayered stack of at least one of the aforementioned dielectric capping materials.

Figure 11:
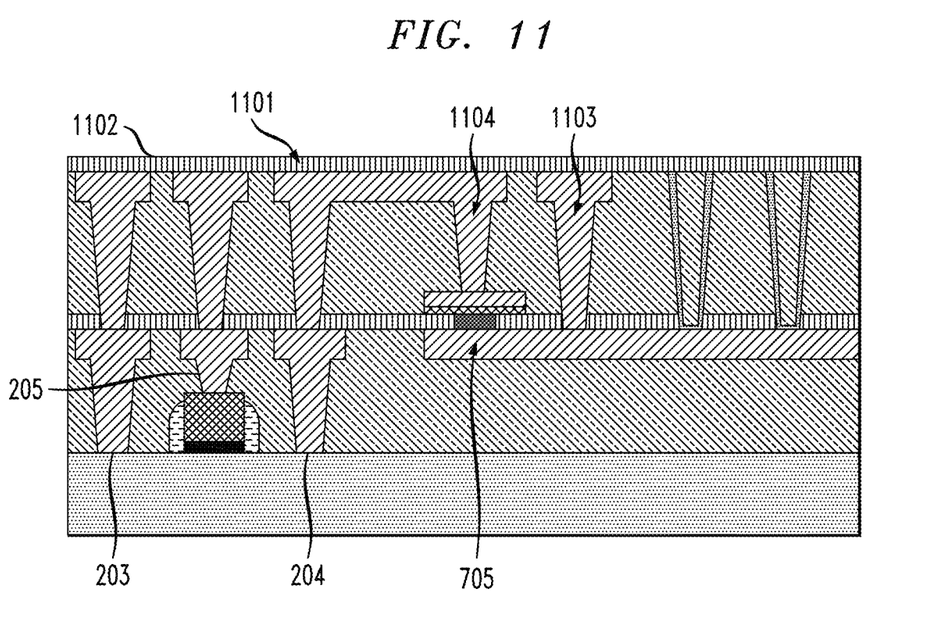

According to some embodiments, the metal contacts 1101 include at least one second contact 1103 contacting the bottom electrode and at least one third contact 1104 contacting the top electrode.

Figure 12:
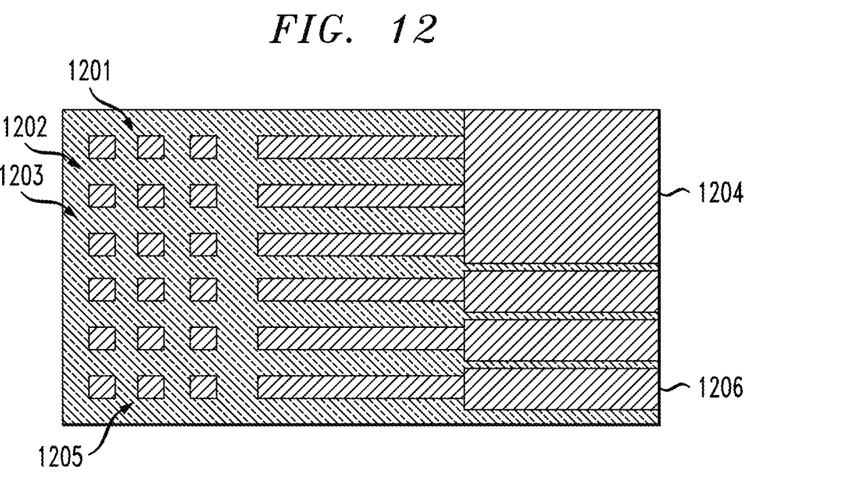
FIG. 12 is a planar view of a device according to one or more embodiments of the present invention.

According to some embodiments and referring to FIG. 12 multiple memory cells, e.g., a first memory cell 1201, a second memory cell 1202, and a third memory cell 1203 can share a common bottom plate 1204 of the stack. That is, multiple bottom electrodes of the memory cells can share a bottom plate. According to some embodiments, a memory cell, e.g., a forth memory cell 1205 has a respective bottom plate 1206.

Figure 13:
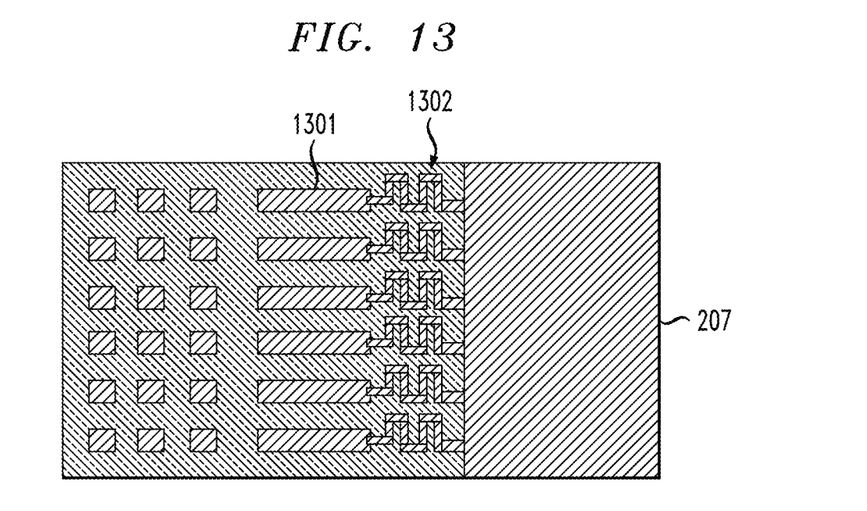
FIG. 13 is a planar view of a device according to one or more embodiments of the present invention.

According to some embodiments and referring to FIG. 13, a bottom electrode stub 1301 is connected to the bottom plate 207 by a metal lead 1302 configured to set a resistance (e.g., having a predetermined resistance), which limits a current supplied to the memory cell.

Figure 14:
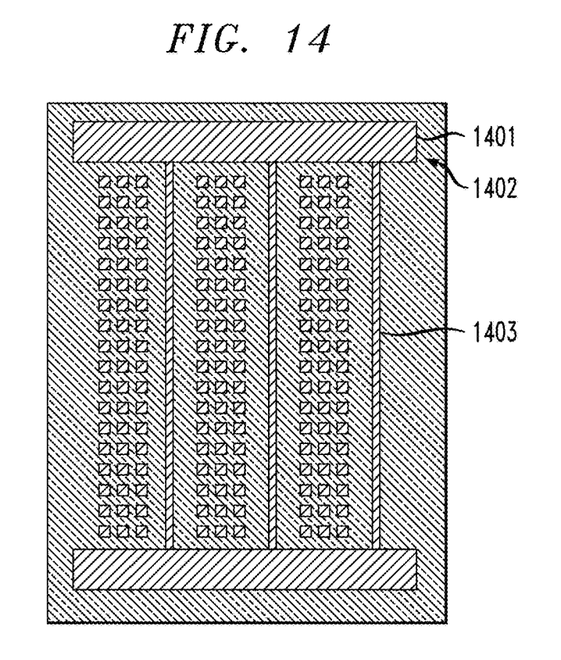
FIG. 14 is a planar view of a device according to one or more embodiments of the present invention.

According to some embodiments and referring to FIG. 14, to increase an area ratio difference between the top electrode and the bottom electrode, a bottom electrode pad 1401 may be disposed in a peripheral area 1402. In FIG. 14, the bottom plate is replaced by bottom electrode lines, e.g., bottom electrode line 1403.

Figure 15:
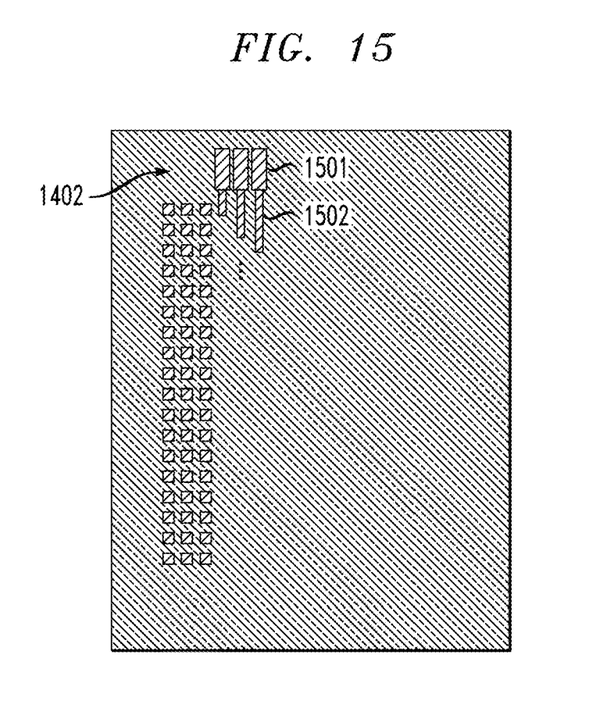
FIG. 15 is a planar view of a device according to one or more embodiments of the present invention.

According to some embodiments and referring to FIG. 15, to increase an area ratio difference between the top electrode and the bottom electrode, a plurality of separate bottom pads, e.g., separate bottom pad 1501, are disposed in the peripheral area 1402, where the separate bottom pad 1501 has a respective bottom electrode line 1502.

Figure 16:
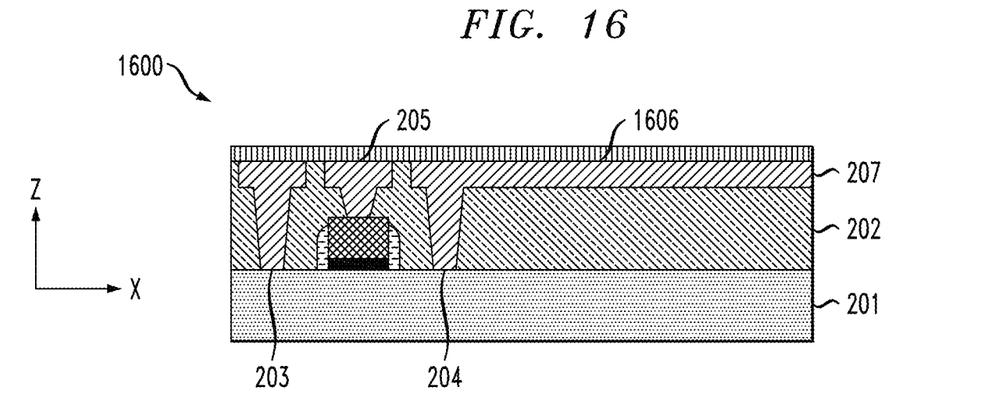
FIG. 16 is cross-section view of a device according to one or more embodiments of the present invention.
Figure 17:
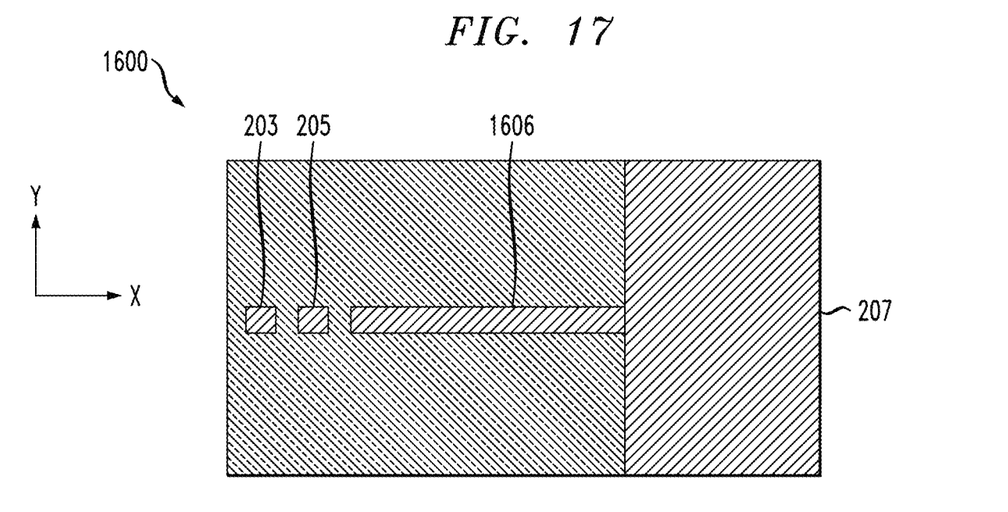
FIG. 17 is a planar view of the device of FIG. 16.

According to some embodiments and referring to FIG. 16 and FIG. 17, a second FEOL structure 1600 includes the substrate 201, an interlevel dielectric layer 202, a source terminal 203, a drain terminal 204, and a gate terminal 205 in the interlevel dielectric layer. The second FEOL structure 1600 further includes a second bottom electrode 1606 extending from the bottom plate 207 to the drain terminal 204.

Recapitulation:

According to embodiments of the present invention, a resistive memory includes: a bottom electrode 206; a first contact 401 on the bottom electrode; a switching material pad 704 on the first contact, wherein the switching material pad includes an oxide and a plurality of current conducting filaments 703 in the oxide (dielectric switching material pad 503); a top electrode 502 on the switching material pad; a plurality of sacrificial vias 903 contacting the bottom electrode; a second contact 1103 that is connected to the bottom electrode; and a third contact 1104 that is connected to the top electrode.

According to embodiments of the present invention, a resistive memory includes: a substrate 201; an interlevel dielectric layer 202 on the substrate; a transistor 209 in the interlevel dielectric layer; a bottom electrode 206; a first contact 401 on the bottom electrode; a switching material pad 704 on the first contact, wherein the switching material pad includes a plurality of current conducting filaments 703; a top electrode 502 on the switching material pad; a plurality of sacrificial vias 903 contacting the bottom electrode; a second contact 1103 that is connected to the bottom electrode; and a third contact 1104 that is connected to the top electrode, wherein the third contact is electrically connected to the transistor.

According to at least one embodiment, a method of manufacturing a resistive memory includes: providing a front end of line structure (at step 101) comprising a substrate, an interlevel dielectric layer, a transistor in the interlevel dielectric layer, and a bottom electrode; forming a first contact on the bottom electrode (at step 102); depositing an oxide layer (at step 103); depositing an electrode material (at step 103); etching the oxide layer and the electrode material (at step 104) to define a stack on the first contact; depositing a first fill material (at step 105); etching the first fill material to form a plurality of first vias (at step 106), including respective ones of first vias exposing the stack and the bottom electrode; performing a charge process (at step 107), which electroforms a current conducting filament in the stack; depositing a passivation liner (at step 108); filling the plurality of first vias with an insulating material fill (at step 109), wherein the plurality of first vias, having the passivation liner and the insulating material fill form a plurality of sacrificial vias; etching the interlevel dielectric layer to form a plurality of second vias (at step 110), with respective ones of the plurality of second vias exposing the stack, the bottom electrode, the transistor, wherein the etching removes some, but less than all, of the plurality of sacrificial vias; and forming contacts in the plurality of second vias (at step 111), wherein the contacts electrically connect the transistor to the stack.

The terminology used herein is for the purpose of describing particular embodiments only and is not intended to be limiting of the invention. As used herein, the singular forms "a," "an" and "the" are intended to include the plural forms as well, unless the context clearly indicates other-wise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A resistive memory comprising:
   a bottom electrode;
   a first contact on the bottom electrode;
   a switching material pad on the first contact, wherein the switching material pad includes an oxide and a plurality of current conducting filaments in the oxide;
   a top electrode on the switching material pad;
   a plurality of sacrificial vias contacting the bottom electrode;
   a second contact that is connected to the bottom electrode; and
   a third contact that is connected to the top electrode.

2. The resistive memory of claim 1, further comprising:
   a substrate;
   an interlevel dielectric layer on the substrate; and
   a transistor in the interlevel dielectric layer, wherein the transistor comprises:
      a source terminal;
      a drain terminal; and
      a gate terminal,
   wherein the third contact is electrically connected to the transistor.

3. The resistive memory of claim 2, wherein the third contact is electrically connected to the drain terminal of the transistor.

4. The resistive memory of claim 1, further comprising a bottom plate, wherein the bottom electrode extends from the bottom plate, wherein the bottom plate is connected to a plurality of bottom electrodes, including the bottom electrode.

5. The resistive memory of claim 1, further comprising a bottom plate, wherein the bottom electrode is connected to the bottom plate by a metal lead configured to limit a current supplied to a memory cell comprising the switching material pad.

6. The resistive memory of claim 1, wherein the plurality of sacrificial vias comprise:
   a passivation liner; and
   an insulating material fill on the passivation liner.

7. A resistive memory comprising:
   a substrate;
   an interlevel dielectric layer on the substrate;
   a transistor in the interlevel dielectric layer;
   a bottom electrode;
   a first contact on the bottom electrode;
   a switching material pad on the first contact, wherein the switching material pad includes a plurality of current conducting filaments;
   a top electrode on the switching material pad;
   a plurality of sacrificial vias contacting the bottom electrode;
   a second contact that is connected to the bottom electrode; and
   a third contact that is connected to the top electrode, wherein the third contact is electrically connected to the transistor.

8. The resistive memory of claim 7, wherein the transistor comprises:
   a source terminal;
   a drain terminal; and
   a gate terminal.

9. The resistive memory of claim 8, wherein the third contact is electrically connected to the drain terminal of the transistor.

10. The resistive memory of claim 7, further comprising a bottom plate, wherein the bottom electrode extends from the bottom plate.

11. The resistive memory of claim 10, wherein the bottom plate is connected to a plurality of bottom electrodes, including the bottom electrode.

12. The resistive memory of claim 10, further comprising a bottom plate, wherein the bottom electrode is connected to the bottom plate by a metal lead configured to limit a current supplied to a memory cell comprising the switching material pad.

13. The resistive memory of claim 7, further comprising:
   a bottom electrode plate; and
   a plurality of bottom electrode lines, wherein a first bottom electrode line of the plurality of bottom electrode lines is connected to the bottom electrode.

14. The resistive memory of claim 7, wherein the first contact is above the interlevel dielectric layer.

15. The resistive memory of claim 7, wherein the plurality of sacrificial vias comprise:
   a passivation liner; and
   an insulating material fill on the passivation liner.

16. The resistive memory of claim 7, wherein the switching material pad includes an oxide.

* * * * *